(12) United States Patent
Kanayama et al.

(10) Patent No.: US 6,939,409 B2
(45) Date of Patent: *Sep. 6, 2005

(54) CLEANING METHOD AND ETCHING METHOD

(75) Inventors: Tokiko Kanayama, Amagasaki (JP); Hiroaki Kouno, Yawata (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/451,202

(22) PCT Filed: Dec. 18, 2000

(86) PCT No.: PCT/JP00/08974

§ 371 (c)(1), (2), (4) Date: Jul. 23, 2003

(87) PCT Pub. No.: WO02/50883

PCT Pub. Date: Jun. 27, 2002

(65) Prior Publication Data

US 2004/0108296 A1 Jun. 10, 2004

(51) Int. Cl.$^7$ ................................ B08B 5/00
(52) U.S. Cl. .......................... 134/2; 134/21; 134/22.1; 134/22.11; 134/22.12; 134/26; 134/36; 134/31; 134/34; 134/37; 134/42; 134/30
(58) Field of Search .................. 134/21, 22.1, 22.11, 134/22.12, 26, 30, 31, 34, 36, 37, 42

(56) References Cited

U.S. PATENT DOCUMENTS 5,298,112 A * 3/1994 Hayasaka et al. ............. 216/67
5,716,495 A * 2/1998 Butterbaugh et al. ........ 438/708
6,124,211 A * 9/2000 Butterbaugh et al. ........ 438/708
6,409,876 B1 * 6/2002 McQuarrie et al. ..... 156/345.29
2002/0007246 A1 * 1/2002 Baur et al. ................... 701/209
2002/0011463 A1 * 1/2002 Buskirk et al. ................ 216/64
2004/0069318 A1 * 4/2004 Kanayama et al. ............ 34/1.3

FOREIGN PATENT DOCUMENTS

| JP | 04-096222 | 3/1992 |
| JP | 07-122539 | 5/1995 |
| WO | WO-98/47172 A1 | 10/1998 |

OTHER PUBLICATIONS

Patent Abstracts of Japan for JP07–122539 published on May 12, 1995.
Patent Abstracts of Japan for JP04–096222 published on Mar. 27 1992.

* cited by examiner

Primary Examiner—Sharidan Carrillo
(74) Attorney, Agent, or Firm—Darby & Darby

(57) ABSTRACT

A cleaning method and an etching method for removing, by cleaning grease components and silicon micro pieces hard to remove, used for an apparatus and a carrier for manufacturing a semiconductor wafer or a semiconductor device. Matters to be removed are brought into contact with $XeF_2$ gas produced by sublimation in a vacuum atmosphere to decompose and gasify the grease components and to remove silicon pieces by etching. If a trace of residual water is left in the vacuum atmosphere before the cleaning, the $H_2O$ reacts with $XeF_2$, so that HF is produced. Therefore, for example, the native oxide $SiO_2$ formed on the silicon pieces can be removed, and $XeF_2$ can directly react with silicon, thereby enabling etching. The cleaning and etching speeds are extremely accelerated.

10 Claims, 2 Drawing Sheets

CLEANING METHOD AND ETCHING METHOD

CROSS REFERENCE TO PRIOR APPLICATION

This is a U.S. national phase application under 35 U.S.C. §371 of International Patent Application No. PCT/JP00/08974, filed Dec. 18, 2000. The International Application was published in Japanese on Jun. 27, 2002 as WO 02/50883 A1, under PCT Article 21(2).

TECHNICAL FIELD

The present invention relates to a cleaning method of cleaning away, using $XeF_2$ gas, an oil film caused by oily components or the like that have leaked out from a pump or the like of any of various manufacturing apparatuses installed in a clean room or sebum generated from workers, and a dry cleaning method and an etching method capable of removing polymer, grease, metal, a native oxide on silicon and so on, for example removing by cleaning extremely minute silicon pieces that have become stuck in a carrier.

BACKGROUND ART

In the manufacture of semiconductor wafers and semiconductor devices, regarding manufacturing apparatuses, to prevent various types of soiling, attached substances, and so on, or due to vapor deposition processes being carried out, in general hermetically sealed chambers are used, and apparatuses in which such chambers are connected together are widely used.

Moreover, in the manufacture of semiconductor wafers and semiconductor devices, housing means called a wafer carrier is used for conveying wafers and transferring the wafers between apparatuses. With such a wafer carrier, a large number of semiconductor wafers are held in a line by means of a large number of grooves provided in an inside surface of the wafer carrier.

Every time the degree of integration of semiconductor devices is increased, it is required to reduce the amount of attached matter on semiconductor wafers, and hence there is an increase in the required degree of cleanliness in the various process apparatuses and so on. Consequently, oil films and so on caused by oily components or the like that have leaked out from a pump or the like of any of various manufacturing apparatuses installed in a clean room or sebum generated from workers in the clean room, which are difficult to remove, are the most loathed contaminants.

In the case of cleaning a series of apparatuses that have been installed using a cleaning liquid containing a surfactant or the like, another way of cleaning is required, and hence contamination occurs in chain-like fashion; in general, a surfactant is thus not included in the cleaning liquid, and hence it is extremely difficult to remove the above-mentioned oil films and so on.

Furthermore, carriers of which the inside and outside surfaces have become soiled through repeated use are cleaned since this soiling will cause contamination of the semiconductor wafers. Up until now the cleaning of wafer carriers has been carried out through automatic cleaning using a high-pressure jet, Megasonic cleaner or the like, or hand brush cleaning using an organic solvent. However, it has not been easy to remove extremely minute silicon pieces that have become stuck in a carrier.

DISCLOSURE OF THE INVENTION

It is an object of the present invention to provide a cleaning method which, in the case of any of various apparatuses, a carrier or the like used in the manufacture of semiconductor wafers or semiconductor devices, is capable of removing by cleaning minute silicon pieces and grease that are difficult to remove.

Aiming for a method capable of removing by cleaning grease, minute silicon pieces, a silicon oxide film and so on, which are difficult to remove, for example capable of cleaning away such substances even from the inside of an airtight chamber, the present inventors carried out various studies into decomposed substances such as the above-mentioned grease and the like, and as a result discovered that if $XeF_2$ gas obtained by sublimation is made to come into contact with and act on an article to be cleaned in a vacuum atmosphere, then the above-mentioned grease and the like can be decomposed and vaporized, and silicon pieces and the like can be removed by etching.

Moreover, the present inventors discovered that if a trace of residual water is left behind in the above-mentioned vacuum atmosphere, then the $H_2O$ and the $XeF_2$ react with one another to produce HF, and hence for example a native oxide on silicon formed on the surface of silicon pieces or the like can be removed, and then subsequently the silicon can be etched through the $XeF_2$ acting directly on the silicon, whereby the cleaning and etching reactions are extremely rapid; the present invention was thus achieved.

That is, the present invention provides a cleaning method and an etching method, characterized by causing $XeF_2$ gas to come into contact with and act on an article to be cleaned in a reduced-pressure or vacuum atmosphere or a vacuum atmosphere containing a trace of water.

Moreover, the present invention also proposes a cleaning method and an etching method characterized in that, in the above methods, the article to be cleaned (article to be processed) is a gas passageway or the inside of any of various chambers of a semiconductor wafer or device manufacturing apparatus, or any of a semiconductor wafer, a semiconductor device, and a carrier thereof.

The present invention provides a cleaning method in which $XeF_2$ gas contacts and acts on an article to be cleaned in a vacuum atmosphere containing a trace of water. Then, the $XeF_2$ gas contacts and acts on the article to be cleaned in a vacuum atmosphere not containing water.

The present invention also provides an etching method in which $XeF_2$ gas contacts and acts on an article to be processed in a vacuum atmosphere containing a trace of water. Then, the $XeF_2$ gas contacts and acts on the article to be processed in a vacuum atmosphere not containing water.

BEST MODE FOR CARRYING OUT THE INVENTION

Figure 1:
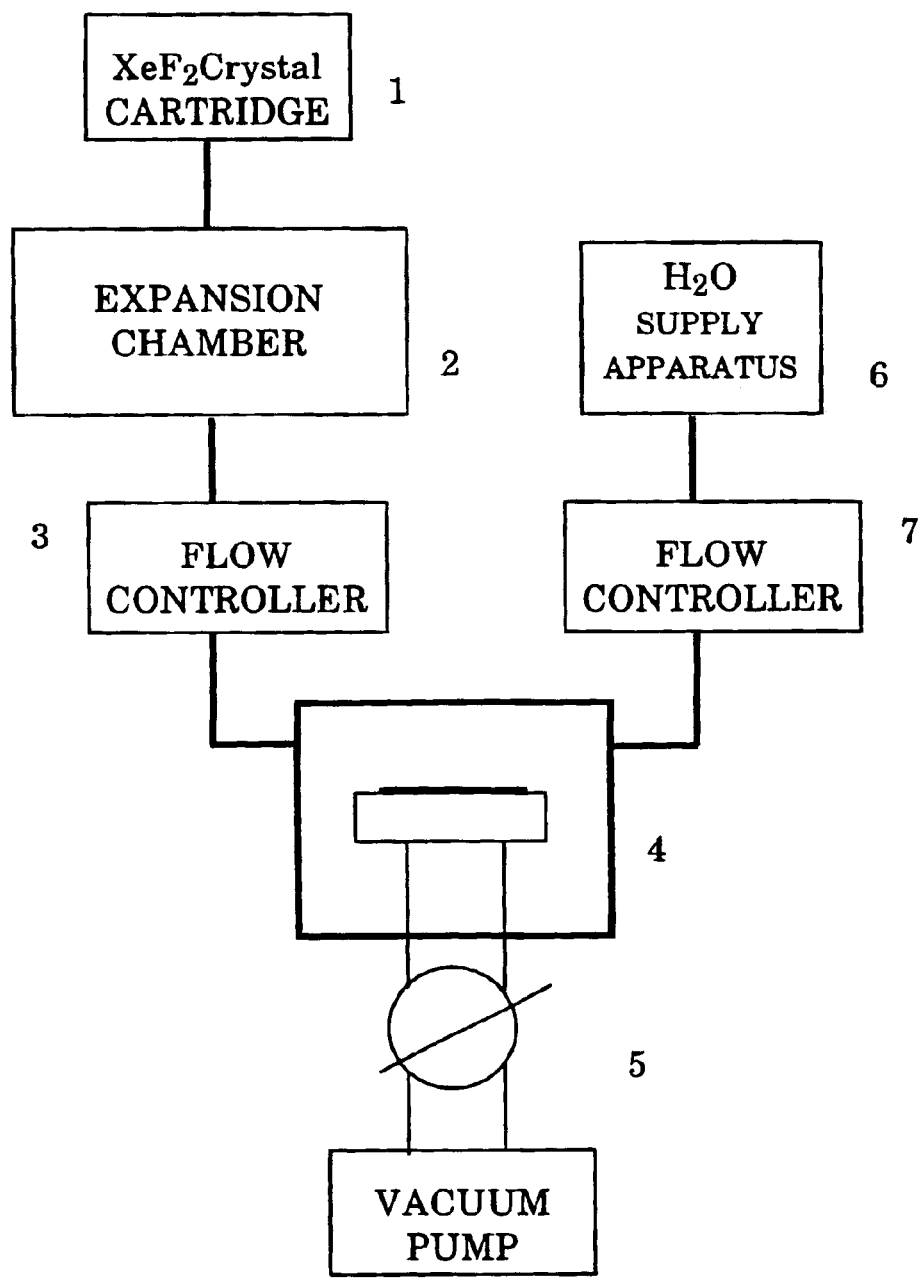
FIG. 1 is an explanatory drawing showing a constitution in which an apparatus for continuously supplying $XeF_2$ gas is connected to a chamber of a device manufacturing apparatus.

In the present invention, $XeF_2$ is used as a gas at raised temperature or in a reduced-pressure or vacuum atmosphere; conventionally, $XeF_2$ gas is known as a gas for isotropic etching of silicon. The present inventors discovered that such $XeF_2$ gas has a function of decomposing and vaporizing grease, and the present invention utilizes this effectively.

Moreover, the present inventors discovered that if $XeF_2$ gas is reacted with a trace of residual water or added water in the atmosphere to produce HF gas, and for example an SiO$_2$ oxide film on a silicon wafer is removed using the HF gas, and then etching of the silicon is carried out using the XeF$_2$ gas, then the total processing time can be shortened; the present invention utilizes this effectively.

In the case of cleaning the inside of a gas passageway and/or the inside of any of various chambers of a semiconductor wafer or device manufacturing apparatus, the inside of the chamber or passageway to be cleaned is evacuated, and XeF$_2$ gas obtained by subliming XeF$_2$ crystals using, for example, a low-pressure expansion chamber is introduced into the chamber or passageway to be cleaned using a separate pre-existing gas passageway, whereby grease attached to the inside of the chamber or passageway to be cleaned is decomposed and vaporized, and then evacuation is carried out, thus completing exhaustion of the XeF$_2$ gas; cleaning of the inside of the chamber or passageway can thus be achieved.

In the case of cleaning a carrier, by adding an XeF$_2$ processing step that also combines drying to a conventional carrier cleaning process, it becomes possible to remove extremely minute silicon pieces, an oil film, and a native oxide on silicon, which could not be removed conventionally.

For example, the inside of a dry processing chamber housing the carrier is evacuated, XeF$_2$ gas is introduced in from an XeF$_2$ gas supply unit, and is thus made to come into contact with and act on the carrier and hence decompose and vaporize grease attached to the carrier, and moreover etching of silicon pieces attached to the carrier is carried out. When blowing on the gas in this processing process, only the XeF$_2$ gas is blown on.

During the above-mentioned evacuation, a trace of residual water is left behind, whereby the H$_2$O and the XeF$_2$ react with one another to produce HF, and hence a native oxide on the silicon pieces is removed in advance; the etching by the XeF$_2$ gas thus becomes more effective.

Subsequently, evacuation is carried out, thus completing exhaustion of the XeF$_2$ gas, and then the pressure inside the chamber is adjusted, thus completing the cleaning of the carrier; a cleaning effect better than with a conventional cleaning technique can be obtained.

As the XeF$_2$ gas supply unit in the present invention, an expansion chamber constituted as indicated in the examples is preferably used. That is, XeF$_2$ gas is obtained by subliming XeF$_2$ crystals in a low-pressure expansion chamber, and when the pressure inside the expansion chamber drops due to the XeF$_2$ processing, the crystals naturally start to sublime again, whereby it becomes possible to supply the XeF$_2$ gas continuously.

Moreover, a conventional publicly-known pulse process in which gas supply and exhaustion are carried out alternately can also be used with the present invention, although there is a problem of the processing time becoming long.

When etching a silicon wafer according to the present invention, to remove an oxide film formed on the surface thereof, a trace of residual water or added water in the atmosphere is reacted with the XeF$_2$ gas to produce HF gas; however, the etching rate for a native oxide and a thermal oxide film differs according to the concentration of the HF gas itself, and hence it is necessary to suitably select various conditions such as the amounts of the XeF$_2$ gas and the water.

EXAMPLES

Example 1

An XeF$_2$ gas continuous supply apparatus was connected to a chamber of a publicly-known device manufacturing apparatus as shown in FIG. 1. Specifically, the continuous supply apparatus was constituted by connecting an XeF$_2$ crystal cartridge 1 to an expansion chamber 2, and then connecting via a flow controller 3 to a pre-existing gas supply pipe leading to a process chamber 4.

In addition to a gas supply pipe, not shown in the drawing, a vacuum pump apparatus 5 was connected to the process chamber 4, whereby the atmosphere in the chamber 4 could be controlled as desired. Consequently, it becomes possible to accurately control the flow rate of the XeF$_2$ gas introduced into the process chamber 4, and moreover it becomes possible to control the gas flow rate and the process chamber 4 pressure independently of one another.

The inside of the process chamber 4 is evacuated from an air atmosphere to a vacuum, with a required amount of residual water being left behind, or else water vapor is added via a flow controller 3 from an H$_2$O gas supply apparatus 6 using a separate gas pipeline, whereby the amount of water in the atmosphere is controlled in advance to be a prescribed amount. Here, both of these methods were implemented, changing over the chamber.

Next, XeF$_2$ crystals are sublimed in the expansion chamber 2 at a pressure below the sublimation point to obtain XeF$_2$ gas, and once the pressure of the XeF$_2$ reaches the sublimation point (a few Torr), the XeF$_2$ gas is introduced into the process chamber 4.

Here, at an initial stage of gas introduction when water is present in the process chamber 4, the XeF$_2$ reacts therewith to produce HF; a thermal oxide film or the like in the chamber 4 is thus removed by cleaning. After that, as the pressure inside the expansion chamber drops, the crystals naturally start to sublime again, and hence the XeF$_2$ gas is supplied continuously, and thus cleaning by the XeF$_2$ gas is then carried out; a metal, insulating material and polymer adhered to the inside of the chamber 4 could thus be removed by cleaning.

Example 2

Figure 2:
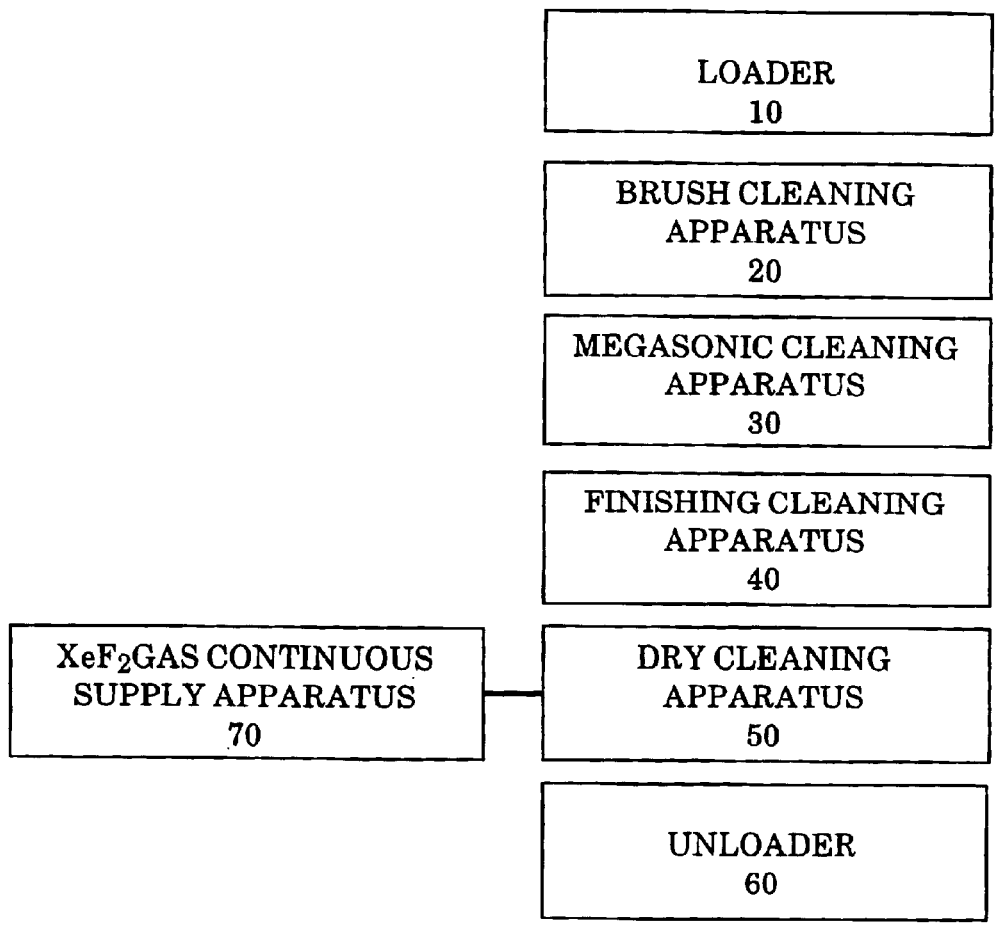
FIG. 2 is an explanatory drawing showing a carrier cleaning process.

As shown in FIG. 2, a wafer carrier automatic cleaning apparatus according to the present invention has a constitution in which a loader 10, a brush cleaning apparatus 20, an megasonic cleaning apparatus 30, a finishing cleaning apparatus 40, a dry cleaning apparatus 50, and an unloader 60 are arranged in tandem.

A wafer carrier to be cleaned is conveyed into the cleaning apparatuses by the loader 10. The wafer carrier that has been conveyed in is then carried to the brush cleaning apparatus 20 by a robot. The brush cleaning apparatus 20 has a cleaning bath and a cleaning robot attached thereto. A cleaning liquid comprising, for example, a mixture of pure water and a neutral detergent is introduced in from a bottom part of the cleaning bath and overflows, whereby the liquid level is kept constant. The constitution is such that a rotating table is provided in the bottom part of the cleaning bath, and the carrier to be cleaned is supported in the bath in a state immersed in the cleaning liquid with an opening part thereof facing upward, and is rotated. The cleaning robot has rotating brushes, and brushes inside and outside surfaces of the carrier.

Once the brush cleaning of the carrier has been completed, the carrier is conveyed to the megasonic cleaning apparatus 30 by the robot. The megasonic cleaning apparatus 30 is able to clean the carrier using ultrasound generated in warm pure water that has been heated to 40 to 60° C. Once the megasonic cleaning has been completed, the carrier is conveyed to the finishing cleaning apparatus 40; the finishing cleaning apparatus 40 holds pure water that is continuously supplied in a laminar flow state from a bottom part of a cleaning bath of the finishing cleaning apparatus 40 and overflows, and the carrier is immersed in this pure water, and is thus subjected to finishing cleaning. Through the megasonic cleaning and the finishing cleaning, minute pieces of foreign matter and soiling remaining on the surfaces of the carrier are removed.

An $XeF_2$ gas continuous supply apparatus 70 as used in Example 1 is connected to the dry cleaning apparatus 50. In the dry cleaning apparatus 50, first the carrier is rotated at approximately 1,000 rpm and thus spin-dried. Next, the inside of the chamber is evacuated (30 to 60 sec), whereby the pressure is reduced and water is removed from the surfaces of the carrier. Furthermore, under a 133.3 Pa to 266.3 Pa (1 Torr to 2 Torr) atmosphere, $XeF_2$ gas is introduced in from the $XeF_2$ gas supply apparatus, whereby cleaning processing is carried out (60 sec).

First, the introduced $XeF_2$ gas reacts with residual water in the chamber to produce HF, and thus an oxide film on the surface of extremely minute silicon pieces that have become stuck in the carrier surfaces is removed by cleaning. Then, the supplied $XeF_2$ acts directly on the carrier; the minute silicon pieces and also attached metal, insulating material, polymer and so on could thus be removed by cleaning.

After that, evacuation is carried out (30 to 60 sec), thus exhausting the $XeF_2$. Then, $N_2$ is vented (20 to 30 sec) to adjust the pressure inside the chamber, and then the carrier is taken out from the dry cleaning apparatus 50 by another robot, and carried to the unloader 60 and stored.

In the dry cleaning apparatus 50, metal, insulating material, polymer and so on, and also extremely minute silicon pieces that have become stuck in the carrier surfaces, which could not be removed by conventional brush cleaning, could be removed.

Example 3

Using a process chamber having an $XeF_2$ gas continuous supply apparatus as used in Example 1, etching of monocrystalline silicon wafers for devices was carried out.

Here, 3 μm-deep pattern formation with 100 mm spacing was carried out on a 4-inch wafer. The $XeF_2$ etching process conditions were $XeF_2$ gas, 15 sccm, and a pressure of 20 Pa (150 m Torr).

Evacuation was carried out to create a prescribed atmosphere, and before commencing the etching, $H_2O$ was added for 5 seconds at a flow rate of 50 sccm from a separate gas introduction port without carrying out exhaustion, thus introducing water vapor into the process chamber. Then, the $XeF_2$ gas was introduced in continuously while carrying out exhaustion, thus carrying out the etching.

Moreover, for comparison, when carrying out the above etching process, the etching was carried out by continuously introducing $XeF_2$ gas, without introducing water vapor before commencing the etching.

In the case of the etching process of the present invention in which water vapor was introduced before commencing the etching, the total process time was 15 minutes. Moreover, in the case of the etching process in which water vapor was not introduced for comparison, the total process time was 18 minutes.

A 5 Å- to 10 Å-thick native oxide was formed on the silicon wafer, but in the case of the etching process of the present invention, it is thought that because water vapor was introduced before commencing the etching and hence HF was generated through reaction with the $XeF_2$, a native oxide on the wafer surface was removed almost instantaneously, and thus the etching by the $XeF_2$ gas was carried out without delay, and hence the etching was carried out at the natural etching rate of silicon by $XeF_2$ gas, i.e. 0.2 μm/min.

However, in the case of the etching process of the comparative example, the $XeF_2$ gas first etches the native oxide, but the etching rate of an $SiO_2$ film by $XeF_2$ gas is extremely slow; a large difference in the total process time thus arose.

INDUSTRIAL APPLICABILITY

With the present invention, in the case of a gas passageway or the inside of any of various chambers of a semiconductor wafer or device manufacturing apparatus, or any of a semiconductor wafer, a semiconductor device, and a carrier thereof, it is possible to remove polymer, grease, metal, a silicon oxide film, and minute silicon pieces, which are difficult to remove.

With the present invention, it is possible to remove an $SiO_2$ oxide film on a silicon wafer using HF gas, and then etch the silicon using $XeF_2$ gas; the total processing time of the etching process can thus be shortened.

What is claim is:

1. A cleaning method comprising:

causing $XeF_2$ gas to contact and act on an article to be cleaned in a vacuum atmosphere containing a residual amount of water, and then causing $XeF_2$ gas to contact and act on the article to be cleaned in a vacuum atmosphere not containing water.

2. The cleaning method according to claim 1, wherein the article to be cleaned is a member of the group consisting of a gas passageway and an inside of a chamber of a semiconductor wafer manufacturing apparatus or a semiconductor device manufacturing apparatus.

3. The cleaning method according to claim 1, wherein the article to be cleaned is a member of the group consisting of a semiconductor wafer, a semiconductor device, and a carrier thereof.

4. The cleaning method according to claim 1, further comprising controlling a gas flow rate of the $XeF_2$ gas.

5. The cleaning method according to claim 1, further comprising controlling an amount of the water in the vacuum atmosphere containing the residual amount of water.

6. The cleaning method according to claim 5, wherein the water amount controlling step comprises adding water vapor to said vacuum atmosphere containing the residual amount of water.

7. The cleaning method according to claim 5, wherein the water amount controlling step comprises leaving a required amount of residual water in the vacuum atmosphere.

8. An etching method comprising:

causing $XeF_2$ gas to contact and act on an article to be processed in a vacuum atmosphere containing a residual amount of water, and then causing $XeF_2$ gas to contact and act on the article to be processed in a vacuum atmosphere not containing water.

9. The etching method according to claim 8, wherein the article to be processed is a member of the group consisting of a gas passageway and an inside of a chamber of a semiconductor wafer manufacturing apparatus or a semiconductor device manufacturing apparatus.

10. The etching method according to claim 8, wherein the article to be processed is a silicon wafer.

* * * * *